United States Patent [19]
Doyle et al.

[11] Patent Number: 6,153,342
[45] Date of Patent: Nov. 28, 2000

[54] SELECTIVE SPACER METHODOLOGY FOR FABRICATING PHASE SHIFT MASKS

[75] Inventors: Brian S. Doyle, Cupertinio, Calif.; Richard Elliot Schenker, Portland, Oreg.

[73] Assignee: Intel Corporation, Santa Clara, Calif.

[21] Appl. No.: 09/345,718

[22] Filed: Jun. 30, 1999

[51] Int. Cl.⁷ ........................................................ G03F 9/00
[52] U.S. Cl. .................................................. 430/5; 430/322
[58] Field of Search ................................ 430/5, 322, 323, 430/324

[56] References Cited

U.S. PATENT DOCUMENTS

5,976,732  11/1999  Pierrat et al. ................................ 430/5
5,985,492  11/1999  Wheeler et al. ............................. 430/5

*Primary Examiner*—S. Rosasco
*Attorney, Agent, or Firm*—Blakely, Sokoloff, Taylor & Zafman LLP

[57] ABSTRACT

A technique for fabricating a phase shift mask with multiple phase shifts by using self-aligned spacers to define phase shifting regions on a surface of a mask substrate. One or more of the phase shifting regions is/are defined by forming one or more self-aligned spacer(s). The spacers are selectively removed one at a time to expose an underlying portion of the mask substrate. The exposed portion of the mask substrate is etched to different depths to form the different phase shifters for the mask.

24 Claims, 10 Drawing Sheets

SELECTIVE SPACER METHODOLOGY FOR FABRICATING PHASE SHIFT MASKS

BACKGROUND OF THE INVENTION

1. Field of the Invention

The present invention relates to the field of semiconductor masks and, more particularly to the fabrication of phase shift masks.

2. Background of the Related Art

The use of photomasks to pattern features on semiconductor wafers by employing optical lithography techniques is known in the art. Integrated circuit (IC) devices,; are fabricated from these patterned features. A more recent application is the use of phase shifting techniques to pattern the features. Phase shifting techniques rely on the interference pattern of the projected light to provide or assist in the image formation at the target. See for example, "Improving Resolution in Photolithography with a Phase-Shifting Mask" by Levenson et al.; IEEE Transactions on Electron Devices, Vol. ED-29, No. 12, December 1992, pp. 1828–1836.

In the standard methods of fabricating phase shift masks, 180° phase shifting regions are formed on or in a transparent substrate, such as quartz or glass. In one technique, the light travelling through the deposited material is phase shifted, due to the refractive index of the deposited material being different than that of the substrate. In the second instance, the open area provides a different medium (typically air) than the substrate to shift the phase of the light travelling through it. It is well known that phase shift masks are capable of providing much improved resolution, so that a smaller critical dimension (CD) can be obtained from imaging a pattern as compared to using binary masks.

Figure 1:
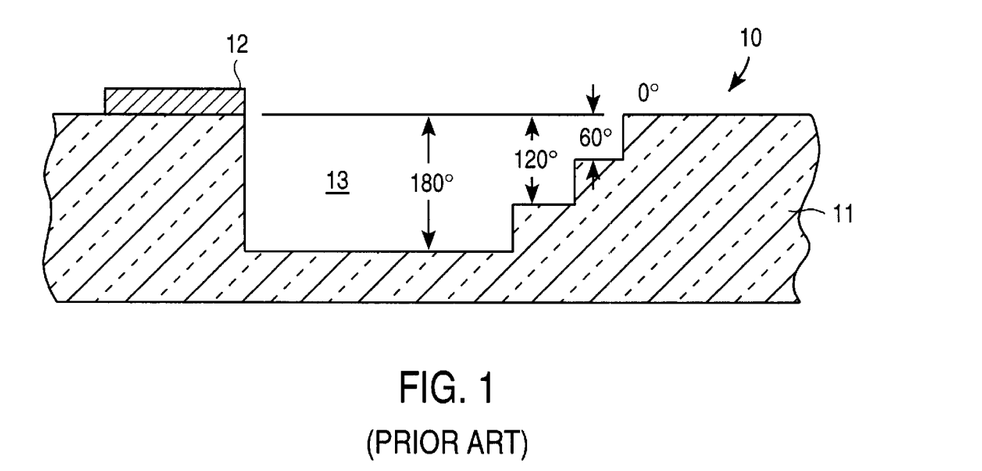
FIG. 1 is a cross-sectional view showing a prior art phase shift mask which incorporates stepped openings etched in the substrate to provide for 60°/120°/180° shifts.

An improved type of phase shift mask known in the art is shown in FIG. 1. Phase shift mask (PSM) 10 is a three-phase PSM having three separate phase shifting regions. PSM 10 is formed from a transparent mask substrate 11. A light absorbing (or attenuating) patterning layer or element 12 is formed on the surface of the substrate 11. Chrome is a common material used for the element 12 to form an opaque image region. The phase shifting regions are shown within an etched opening 13 formed in the substrate 11.

In the simplest of PSMs, the etched opening 13 has one depth to provide an 180° shift. That is, light travelling through the opening is shifted 180° as compared to light travelling through the full thickness of the substrate 11. This is exemplified by the 180° notation between the surface of the substrate 11 and the depth of the opening 13. However, in the three-phase PSM 10 of FIG. 1, three different phase regions are within opening 13. The deepest portion of the opening 13 still provides the 180° shift. The two shallower regions within the opening provide the other two corresponding phase shifts. In a typical three-phase structure, the phase shifts are 60°, 120° and 180°. The surface is referenced as 0°, and the phase shifts are referenced to light travelling this path.

Figure 2:
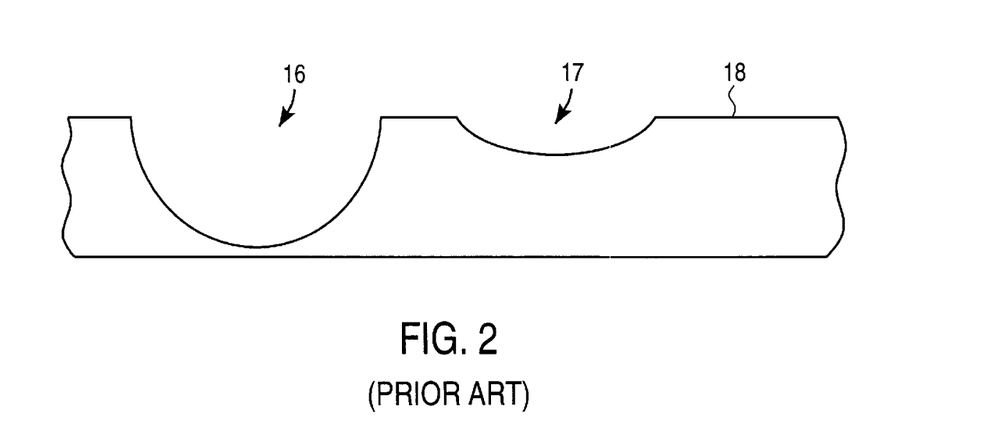
FIG. 2 is a cross-sectional view showing light intensity profiles for the mask of FIG. 1, in which the phase shifters provide for a gentler transition from dark to light.

As shown in FIG. 2, an advantage of using the three-phase shifter of FIG. 1 is the improved transition from 180° to 0°. FIG. 2 shows the transmitted light intensity through the mask 10 of FIG. 1. The very low or no intensity region 16 corresponds to the light blockage by the light absorbing element 12 and the phase shifting area (shown by intensity profile 17) corresponds to the phase shifting region of opening 13. The light region 18 corresponds to the exposed non-shifted (0°) area of the mask. The three-phase shifts provide for a more gradual transition from low to high intensity (dark to light). The three phase steps within opening 13 prevent formation of a sharp low-to-high light intensity region that would normally occur in a transition from a 180° phase region and a 0° phase region without any graduation. The three-phase mask of FIG. 1 inhibits unwanted printing of lines in photoresist, when the mask is used in lithographic imaging. One example of a three phase PSM is disclosed in U.S. Pat. No. 5,308,722 issued to Nistler.

It is appreciated that the PSM 10 has a structure which requires a graduated opening to be formed in the substrate. Generally, utilizing conventional techniques, three separate etching steps are needed to form the three levels of opening 13. For the etching process, three iterations of: depositing photoresist, patterning the photoresist using photolithography, developing the patterned photoresist to expose the underlying substrate and etching the exposed substrate are required. That is, each depth of opening 13 requires a complete lithographic patterning sequence. Thus, for a three-phase PSM shown in FIG. 1, three separate lithographic steps are required. If additional graduations are desired, additional patterning and etching sequences are needed. The present invention provides for a multiple-phase PSM in which separate lithographic patterning steps are not required for forming everyone of the phase shifting graduations.

SUMMARY OF THE INVENTION

The present invention describes a phase shift mask and a method of fabricating the phase shift mask, having a plurality of phase shifts. The phase shift mask is formed by forming a plurality of regions of different materials on a surface of the mask substrate to define different phase shifting regions for the mask, wherein at least one material region is formed as a self-aligned spacer. Then, one material region is selectively removed to expose an underlying portion of the mask substrate. Next, the exposed portion of the mask substrate previously underlying the selectively removed region is removed to form an opening. The selective removal is repeated for the next material region(s), followed by removal of newly exposed and previously exposed regions of the substrate to form openings at different depths as the different phase shifting regions of the mask.

DETAILED DESCRIPTION OF THE INVENTION

A technique is described for fabricating a phase shift mask (also referred to as a phase shifting mask), or PSM, with multiple phase shifters in which one or more of the shifters are formed by using self-aligned spacers as covering masks and selectively removing particular spacers to later remove portions of a mask substrate previously underlying the spacer(s). The present invention is described in reference to FIGS. 3–22 to form a multi-phase PSM, in which one of the embodiments functions equivalently to the mask 10 of FIG. 1 to provide a three-phase transition from dark to light. The three phase shifters are equally spaced at 60°, 120°, 180° to the 0° reference. However, it is appreciated that the actual number of phases or the separation between the phases is a design constraint that can be readily changed to meet design, process or mask requirements.

Figure 3:
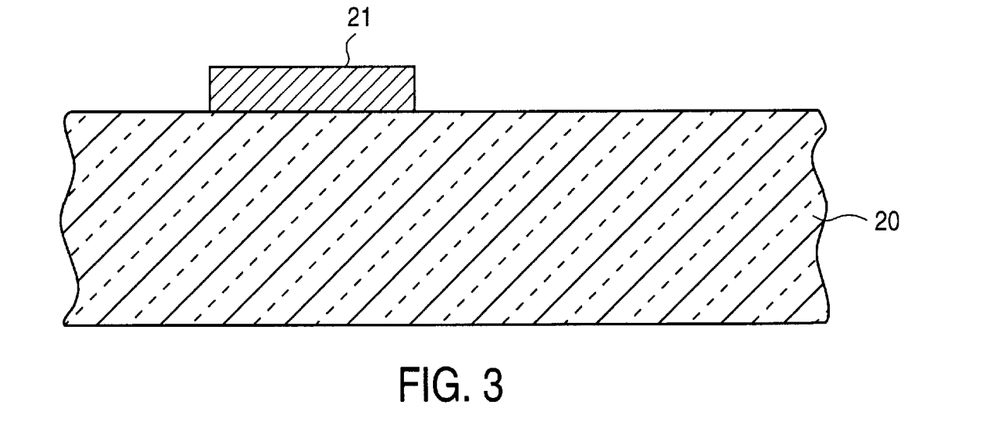
FIG. 3 is a cross-sectional view showing the start of a formation of the phase shift mask of the present invention in which a light absorbing (opaque) element or layer forms an opaque region on the surface of a transparent mask substrate.
Figure 4:
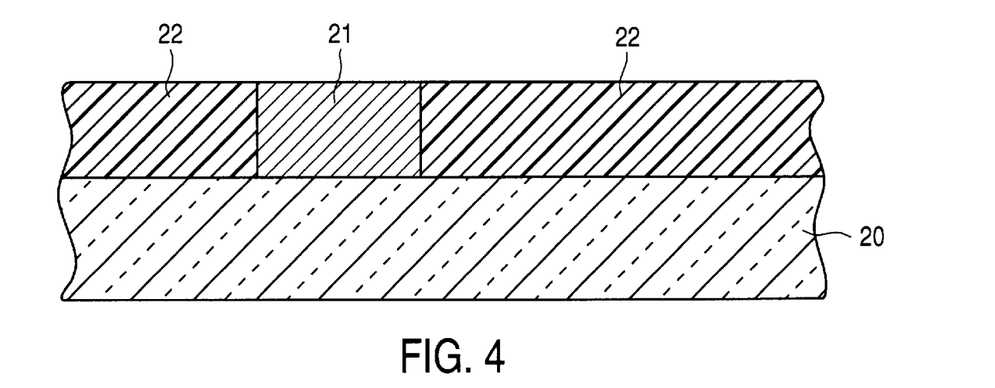
FIG. 4 is a cross-sectional view showing the mask of FIG. 3 and a formation of a first material layer, which is then planarized to the level of the light absorbing material.

Referring to FIG. 3, a mask substrate 20 is shown having a light absorbing (opaque) element or layer 21 formed on its surface. The opaque element is also referred to as an opaque region, since it forms a dark region on the image plane. Substrate 20 is comprised of a transparent material generally used for mask substrates. Fused silicate glass is the more common material used for substrate 20. The opaque element 21 is formed from a material also known in the art for forming such light absorbing (or attenuating) regions. For example, in optical lithography, chrome is one of the more commonly used materials. It is appreciated that the substrate 20 and the opaque region 21 are essentially equivalent to a binary mask structure that is known in the art. Accordingly, a variety of different materials can be used to form the structures 20, 21.

Subsequently, a first material layer 22 is formed onto this structure. The exact technique for forming the material layer is not critical to the understanding of the present invention, since a number of known techniques can be utilized to form the material layer 22. Typically, the material layer 22 is comprised of a dielectric material, which is spin deposited or sputtered to a thickness which covers both the surface of the substrate 20 and opaque region 21. Then, the material layer 22 is planarized, such as by the use of chemical-mechanical polishing (CMP), so that the opaque region 21 is exposed (at which time the exposed chrome operates as a polish stop). The planarization results in the material layer 22 being substantially planar with the surface of the opaque region 21, as exemplified in FIG. 4. In the preferred embodiment, the first material layer is an oxide, such as silicon dioxide ($SiO_2$).

Figure 5:
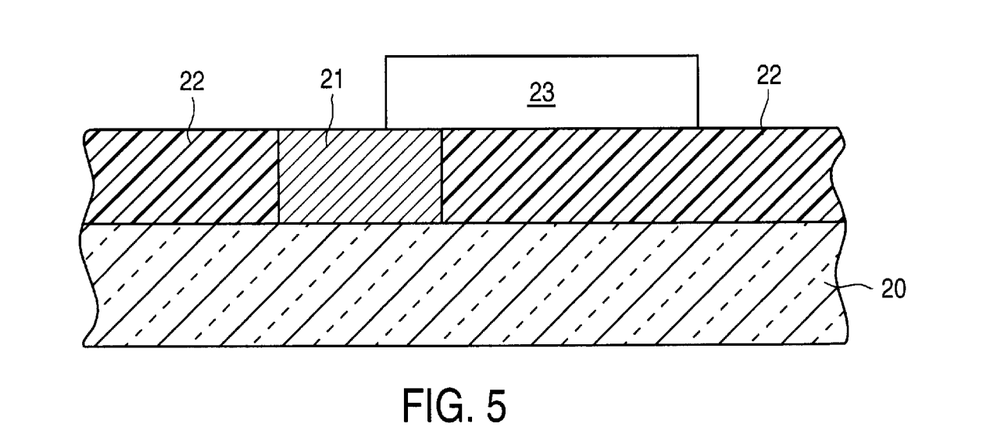
FIG. 5 is a cross-sectional view of the mask of FIG. 4 in which a photosensitive masking layer is patterned and developed to form a mask overlying a portion of the first material layer and the opaque element.

Next, a photosensitive layer (such as a photoresistive layer) 23 is formed and patterned for defining a region which will form a first phase shifting region. The use of a photosensitive layer 23 for patterning is known in the art. Generally, a photosensitive material is deposited, followed by a patterning process (such as with an electron beam) to form a latent image in the photosensitive layer 23, which image is defined by a patterning mask. Then, the photosensitive material is developed to remove either the exposed or unexposed regions (depending on the positive or negative nature of the photosensitive material), which leaves a patterned mask on the surface, as shown in FIG. 5.

The patterned photosensitive layer 23 resides over a portion of the first material layer 22, corresponding to the area which will define the first phase shifting region. In the example, the photosensitive layer 23 overlaps onto the surface of the opaque layer 21 to ensure that the first phase region starts adjacent to the opaque region 21.

Figure 6:
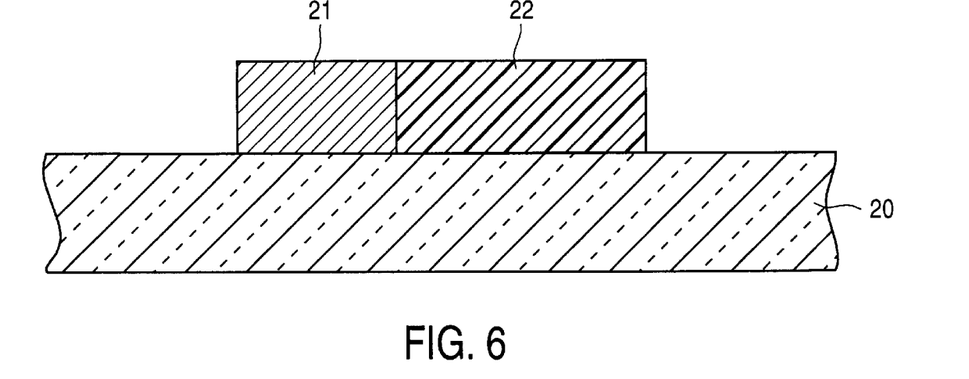
FIG. 6 is a cross-sectional view of the mask of FIG. 5 in which an etching step removes exposed portions of the first material layer, so that only the opaque element and portions of the first material layer previously underlying the photosensitive mask remain on the surface of the substrate to define a first phase shifting region.

Next, by using a known material removal technique (such as an etching technique), the exposed regions of the material layer 22 are etched away. What remains is a portion of the material layer 22 which is adjacent to the opaque region 21. The extent of the remaining layer 22 will then define the first phase shifting region for the PSM. Then, the remaining photosensitive material 23 is removed. The resulting structure is shown in FIG. 6.

Figure 7:
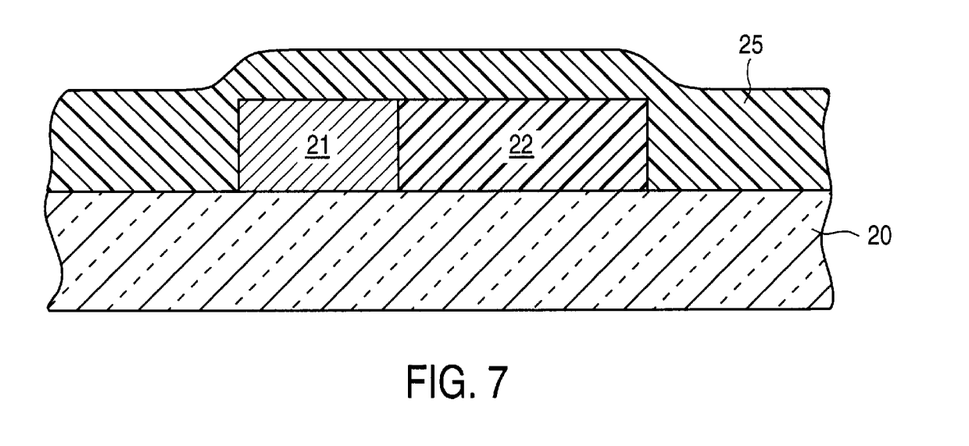
FIG. 7 is a cross-sectional view of the mask of FIG. 6 in which a second material layer is deposited over the mask structure.

Then, as shown in FIG. 7, a second material layer 25 is formed by a known technique (such as by the technique used to form the first material layer). Typically, the second material layer 25 is also comprised of a dielectric material, which is spin deposited or sputtered, as noted earlier with the first material layer. The second material 25 is formed to cover the substrate 20, opaque region 21 and the remaining first material layer 22. In the preferred embodiment, the second material layer is comprised of a nitride material, such as silicon nitride ($Si_3N_4$).

Figure 8:
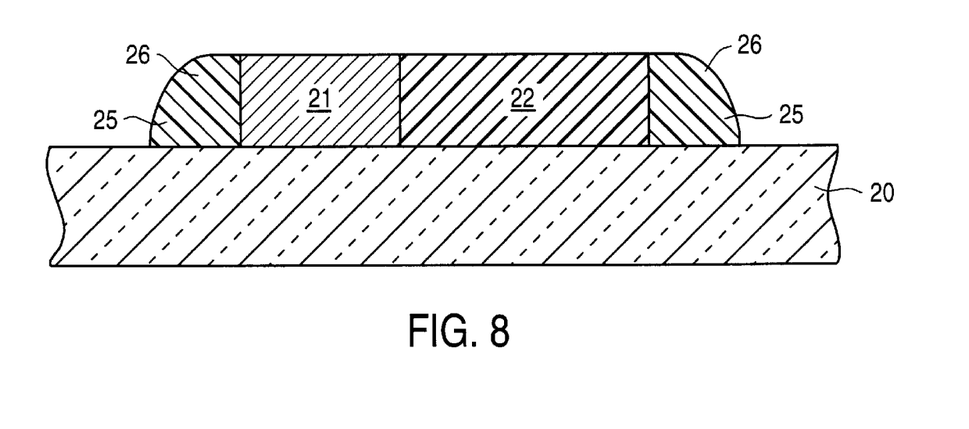
FIG. 8 is a cross-sectional view of the mask of FIG. 7 in which an etching step is used to etch the second material layer, so that only self-aligned spacers formed from the second material remain adjacent to the edges of the first material layer and the opaque element to define a second phase shifting region adjacent to the first phase shifting region.

Subsequently, instead of using a photolithographic masking process, a self-aligned spacer formation process is used to form spacers 26 along the outer edges of the layers 21 and 22, as shown in FIG. 8. A variety of such self-aligned spacer formation processes are known. Generally, the thickness of the formed material layer is greater over the regions adjacent to transitions in the topography. In the example structure, the material layer 25 near the edges of the underlying raised features; (regions 21 and 22) is thicker than along the planar regions. When layer 25 is then anisotropically removed (such as by the use of an anisotropic etch), the spacers 26 are formed along this adjacent region. The width of the self-aligned spacers can be controlled accurately by controlling the thickness of the layer formation and the anisotropy of the etch (for example, by the use of plasma etch). See for example, "100 nm CMOS Gates Patterned with 3σ Below 10 nm" by H. Liu et al.; Proceedings of SPIE Vol. 3331, Feb. 23–25, 1998; pp. 375–381. Typically, width control of 5 nm (at 3σ) can be achieved on spacers of 75–100 nm thickness. Thus, FIG. 8 exemplifies the mask structure having the spacer 26 formations along the edge of the opaque region 21 and the remnant of the first material layer 22 after anisotropic removal of the layer 25. The second material layer 25 remaining adjacent to the first material layer 22 defines the second phase shifting region for the mask.

Figure 9:
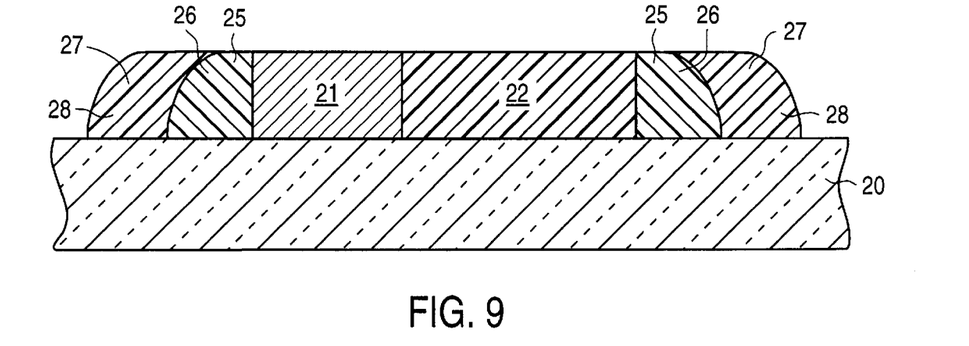
FIG. 9 is a cross-sectional view of the mask of FIG. 8 in which a third material layer is deposited over the mask and an etching step is used to etch the third material layer, so that only self-aligned spacers formed from the third material remain adjacent the edges of the second material to define a third phase shifting region adjacent to the second phase shifting region.

Then, the spacer formation steps are repeated to form a second self-aligned spacer region that will define the third phase shifting region for the mask. In reference to FIG. 9, a third material layer 27 is deposited using a known technique. The third material layer 27 is then anisotropically removed (such as by the use of a plasma etch-back technique), until a self-aligned spacer 28 remains adjacent to the second spacer 26, as shown in FIG. 9. The material selected for the third material layer 27 is selectively different from either the first or the second material layers 22, 25. In the preferred embodiment, the third material layer is comprised of a polysilicon material.

Figure 10:
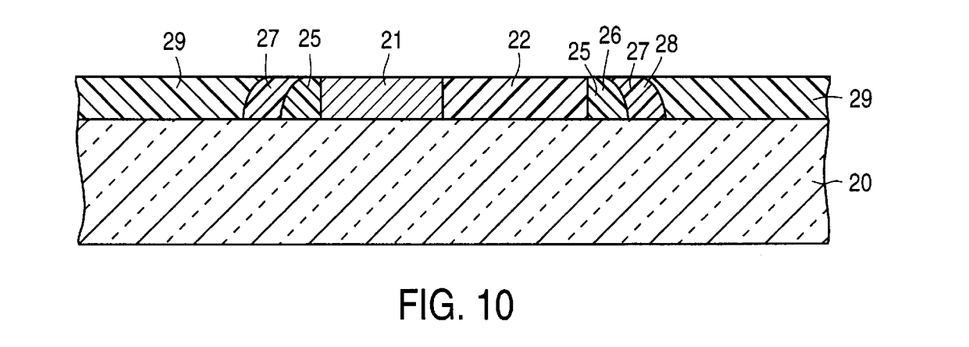
FIG. 10 is a cross-sectional view of the mask of FIG. 9 in which a fourth material layer is formed to mask the remaining portions of the exposed substrate and subsequently planarized so as to have a planar surface for the mask.

Subsequently, after the formation of the first, second and third material regions to define the three phase shifting regions, a fourth material layer 29 is formed over the structure to form a covering or protective layer. The fourth layer is then planarized (such as by the use of CMP) so that a planarized layer 29 remains above the previously exposed substrate 20. Note that anisotropical etching is not required, since the fourth layer 29 is used not to form a spacer region, but rather to provide a protective covering (masking) over the substrate. The material for the fourth layer 29 is selectively different from the three earlier material layers 22, 25 and 27. The resulting structure is shown in FIG. 10. In the preferred embodiment, the fourth layer 29 is comprised of silicon germanium (SiGe).

As noted above, the four layers 22, 25, 27 and 29 formed above the substrate 20, are comprised of selectively different materials. Generally, materials having dielectric properties (dielectric materials) are utilized. In the particular example the first material defining the first phase shift region is comprised of an oxide (for example, $SiO_2$). The second material is comprised of a nitride (for example, $Si_3N_4$). The third material is comprised of polysilicon (PolySi) and the fourth material comprised of SiGe. The materials are selected so that each is etch selective over the other. That is, when a certain etch chemistry is utilized to selectively remove a particular material, the other materials are not removed (at least not at the same or greater rate than the intended material being removed). As will be rioted below, the selectivity accorded by the different materials overlying the mask substrate, allows etching of each phase region for a given etch step to be performed separately to expose the underlying mask substrate 20.

Figure 11:
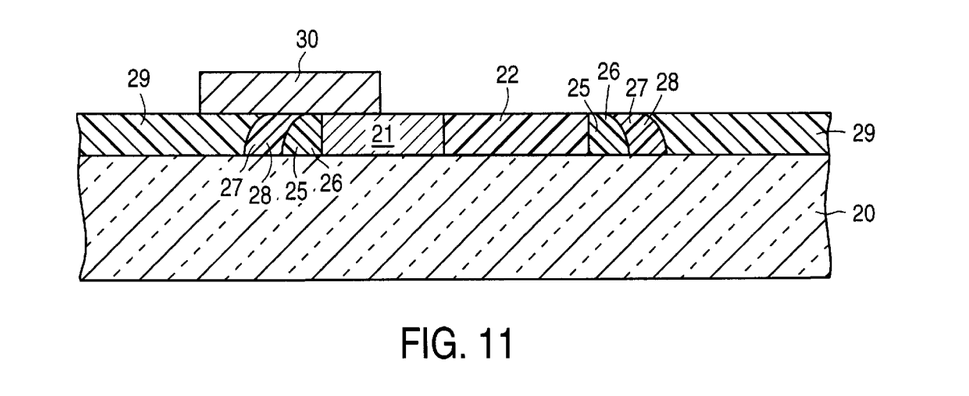
FIG. 11 is a cross-sectional view of the mask of FIG. 10 in which a protective photoresist layer is formed overlying the spacer regions of the second and third materials which do not define phase shifting regions.

Subsequently, a masking step is utilized to form a protective cover over parts of the three material regions which are used for forming the phase shifting regions. In the example, these regions are to the left of the chrome 21. As shown in FIG. 11, a second photolithographic patterning sequence is used to form and pattern a photosensitive material (such as a photoresist) to cover the regions which are not used for defining phase shifters. Thus, a second photosensitive layer 30 is formed, patterned and developed so that it provides a mask over any region which is not to be removed during the phase region formation. Conversely, the regions where the phase shifts are to be formed are not masked.

Figure 12:
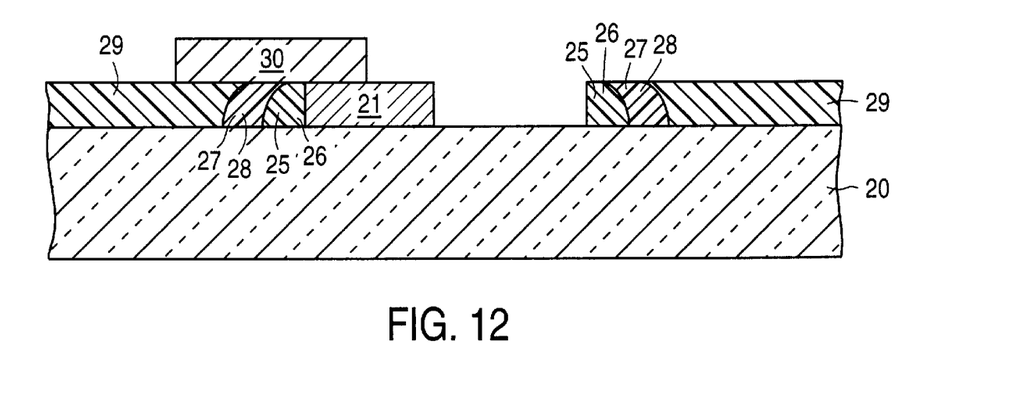
FIG. 12 is a cross-sectional view of the mask of FIG. 11 in which the exposed first material layer is removed to expose the underlying portion of the substrate.
Figure 13:
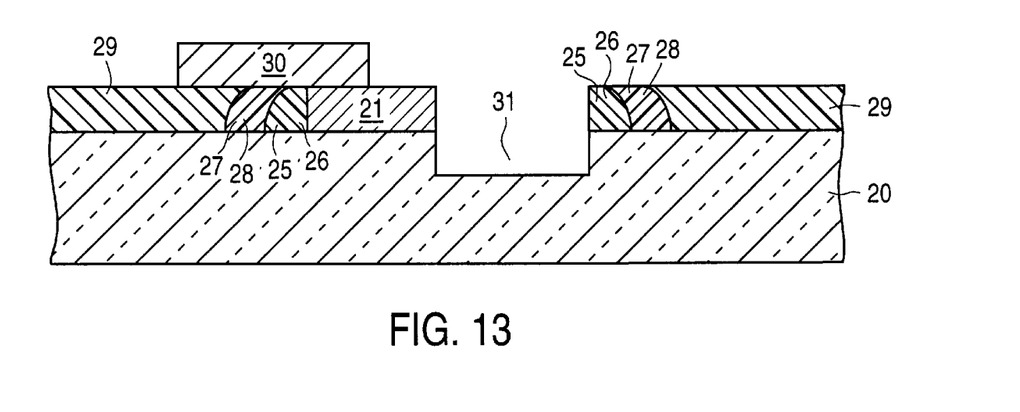
FIG. 13 is a cross-sectional view of the mask of FIG. 12 in which the exposed portion of the substrate is etched to form a first opening.

Next, as shown in FIG. 12, a selective removal technique is used to remove the exposed first material layer 22. A chemistry which is selective to layer 22 is used to remove the material of layer 22, while the other exposed materials are not removed. In the particular example, etching is used to remove the exposed oxide (such as $SiO_2$) to expose the underlying substrate region. Since the etch chemistry is selective, only the oxide is removed completely, so that only this region of the substrate is exposed. This exposed region of the substrate 20 is now subjected to another chemistry, which removes the substrate material, but without removing other materials on the surface. One of a variety of known etch chemistries can be utilized for forming an "opening" or "window" 31 to a predetermined depth. The depth of the opening is generally controlled by the duration of the etch cycle for a given chemistry used.

Figure 14:
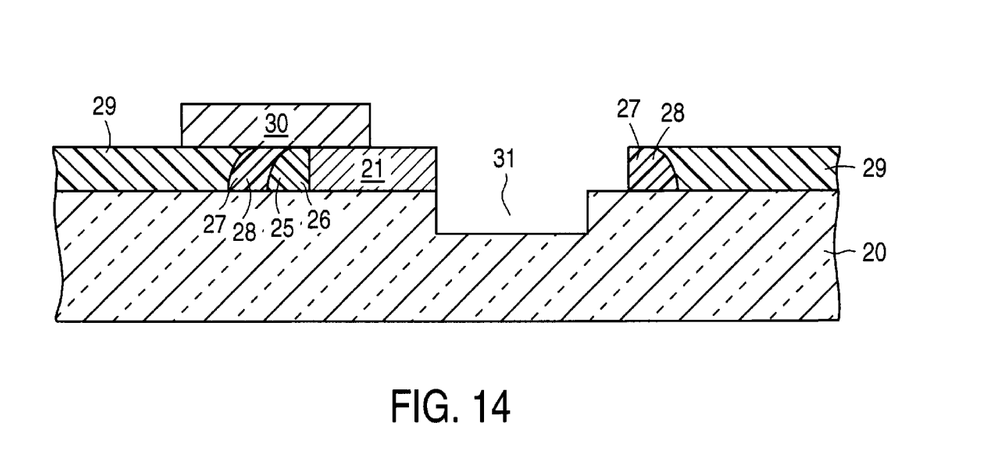
FIG. 14 is a cross-sectional view of the mask of FIG. 13 in which the exposed second material layer is removed to expose the underlying portion of the substrate.
Figure 15:
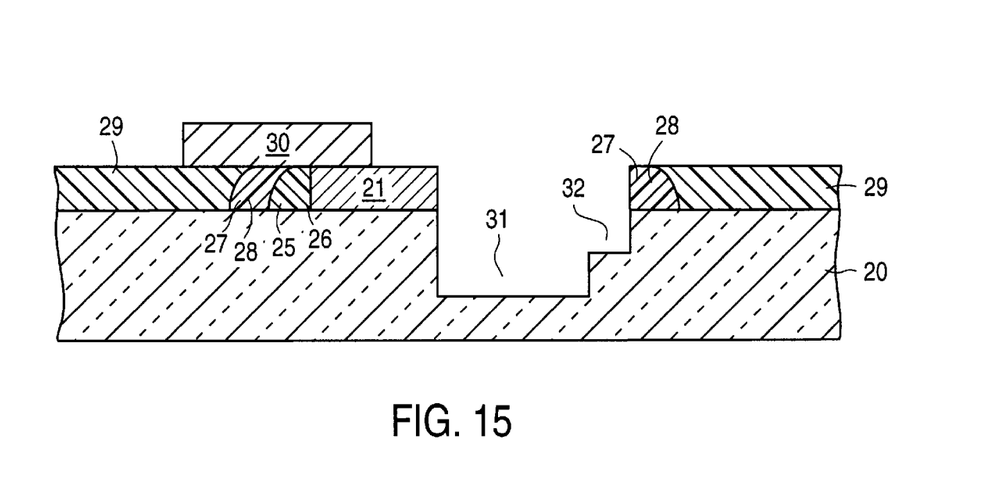
FIG. 15 is a cross-sectional view of the mask of FIG. 14 in which the exposed portions of the substrate previously underlying the first spacer is etched to form a second opening, as well as further etching the first opening.

Then, another selective removal technique is used to remove the exposed second material layer 25. A chemistry which is selective to the layer 25 is used to remove the material layer of spacer 26, while the other exposed materials remain to mask the underlying substrate. In the particular example, etching is used to remove the exposed nitride (such as $Si_3N_4$) to expose its underlying substrate region, as shown in FIG. 14.

Then, the exposed portion of the substrate 20 is again subjected to substrate removal chemistry, which removes the exposed substrate material. As noted in FIG. 15, this second substrate etching step etches the substrate region previously underlying the second material layer 25 to a predetermined depth to form an opening 32. The etch also further increases the depth of the opening 31 so that the two openings 31, 32 are at different depths.

Figure 16:
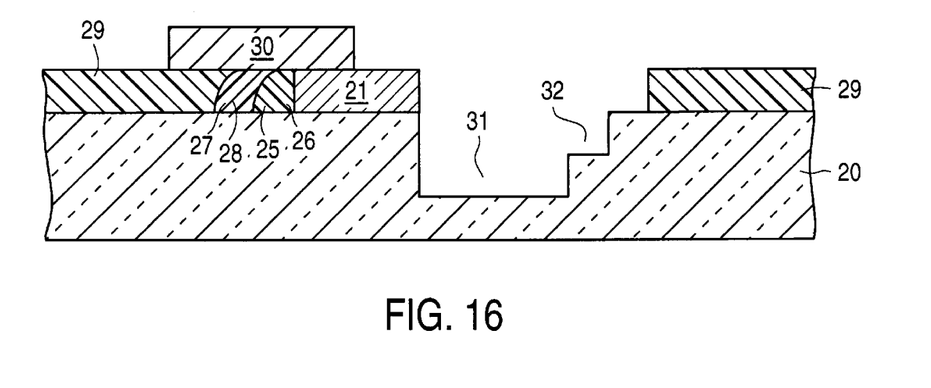
FIG. 16 is a cross-sectional view of the mask of FIG. 15 in which the exposed third material layer is removed to expose the underlying portion of the substrate.

Then, a further selective removal technique is used to remove the exposed third material layer 27. A chemistry which is selective to the layer 27 is used to remove the material layer of spacer 28, while the other exposed materials remain. In the particular example, etching is used to remove the exposed polysilicon to expose its underlying substrate region, as shown in FIG. 16.

Figure 17:
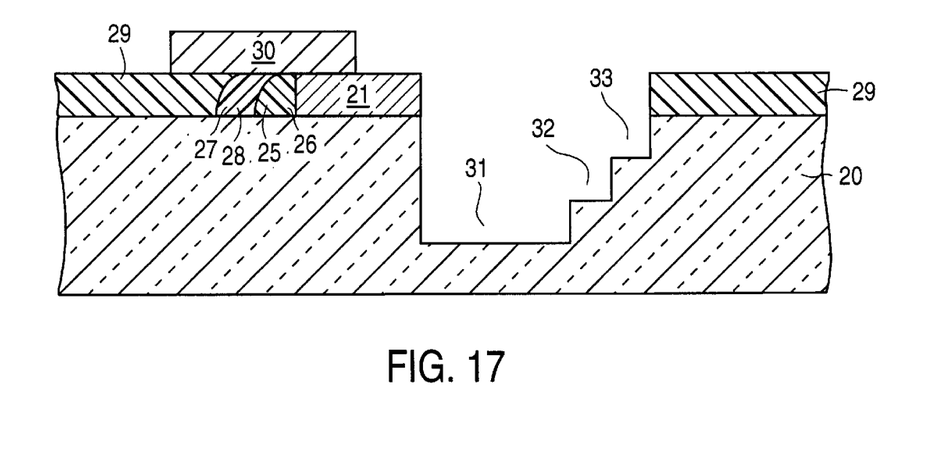
FIG. 17 is a cross-sectional view of the mask of FIG. 16 in which the exposed portions of the substrate previously underlying the second spacer is etched to form a third opening, as well as further etching the first and second openings.

Next, the exposed portion of the substrate 20 is again subjected to the substrate removal chemistry, which removes more of the exposed substrate material. As shown in FIG. 17, this third substrate etching step etches the substrate region previously underlying the third material layer 27 to a predetermined depth to form an opening 33. The etch also further increases the depth of the openings 31 and 32, so that the three openings 31–33 are at different depths.

Subsequently, the protective layer 30 is removed. Where the example utilized a photoresistive layer, one of a variety of known techniques for removing photoresist can be used. Once the underlying material layers are exposed, a variety of techniques known in the art can be used to remove the remaining material layers 25, 27 and 29. The same chemistries as above can be used. However, since the remaining materials need not be selectively removed, other less selective techniques can be used, provided that the formed openings in the substrate are not further eroded. It should be noted that when the fourth material layer is removed, this step will remove all of the remaining SiGe, including the portion of the fourth layer 29 adjacent to opening 33. The final structure is shown in FIG. 18.

Figure 18:
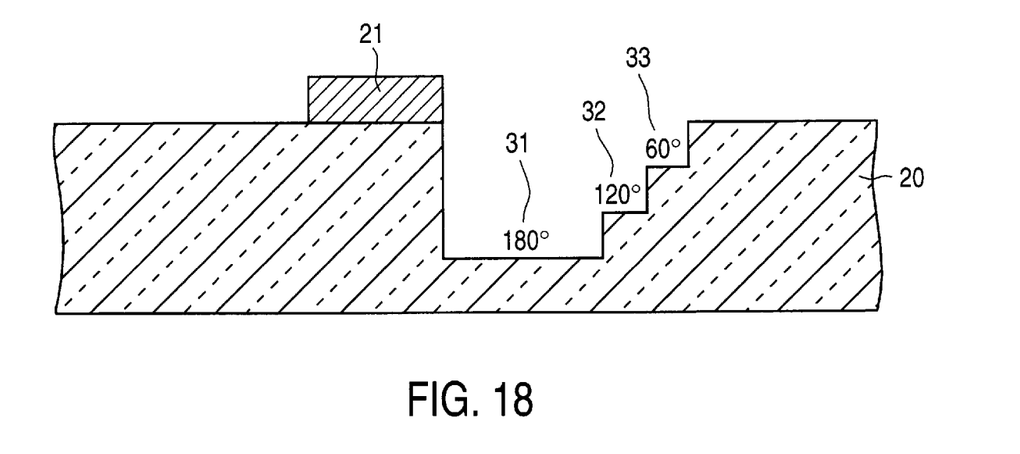
FIG. 18 is a cross-sectional view of the mask of FIG. 17 in which the remaining layers above the substrate, except for the light absorbing region, are removed to form a three phase shifter mask of the present invention.

A phase shift mask 40 of the present invention, shown in FIG. 18, is equivalent to the mask shown in FIG. 1. With proper depth control, the three openings 31–33 will provide the desired 60°/120°/180° phase shifts. However, unlike the prior art mask, the phase shift mask of the present invention utilizes self-aligned spacers to define one or more of the phase shift regions. In the particular example described above, the 60° and 120° phase shift regions are defined by the self-aligned technique. As evident, lithography steps are not utilized in the formation of self-aligned spacers. Accordingly, in the above example, the 60° and 120° shift regions are formed without the use of photolithography patterning steps.

Furthermore, since each formed spacer is self-aligned to the adjacent feature, including a previously formed spacer, the self-aligned technique allows for tight tolerances in the formation of the phase shift regions, permitting the width of the phase shifting regions to be controlled as small as 5–10 nanometers. As shown in the example mask structure 40, the 60° and 120° shift regions are narrower than the 180° region, so that the self-aligned technique lends to providing tighter tolerances and smaller features.

Figure 19:
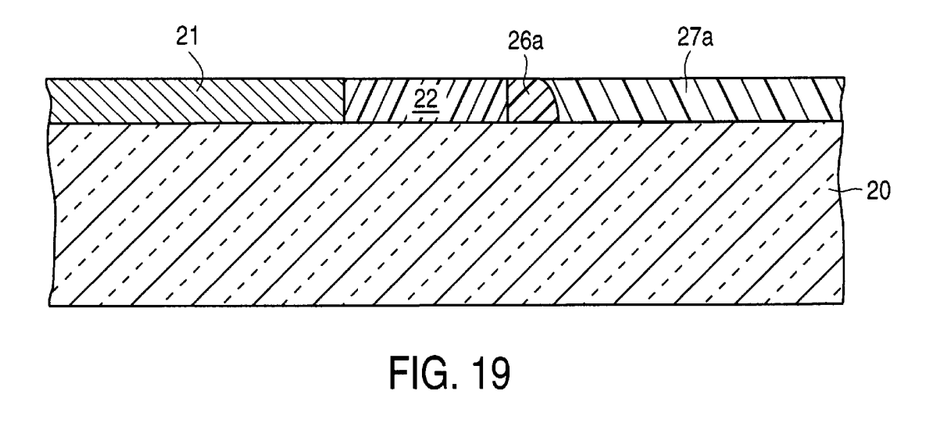
FIG. 19 is a cross-sectional view of an alternative mask in which only one self-aligned spacer is formed for constructing a two-phase, phase shifting mask.
Figure 20:
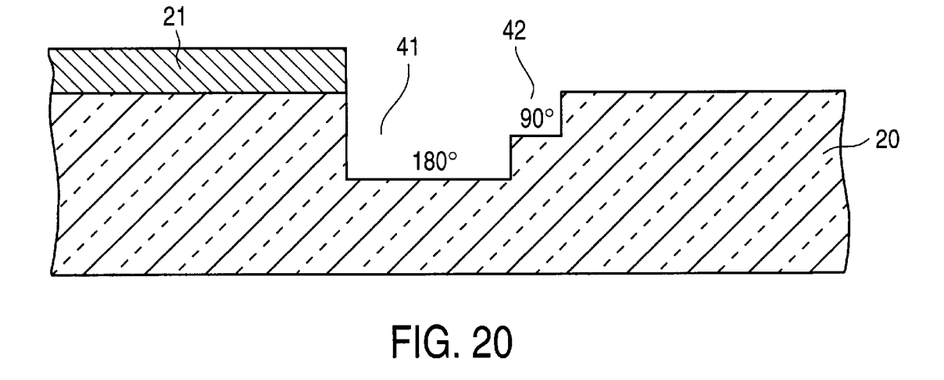
FIG. 20 is a cross-sectional view showing the mask structure when two openings are formed in the substrate to construct the two-phase, phase shifting mask of FIG. 19.

An alternative embodiment is shown in FIGS. 19 and 20. In FIG. 19, only one self-aligned spacer 26a is formed adjacent to the first material region 22. Thus, only two phase shift regions are defined. Instead of forming a second aligned spacer, the third material layer 27a is used to cover the remaining exposed portions of the substrate (equivalent to the use of the fourth material layer 29 in the three-phase example). Subsequently, as shown in FIG. 20, the technique of the present invention is utilized to selectively remove the first and second material layers to form two window regions 41 and 42, which provide the two desired phase shift regions (for example 90° and 180° shifts). Accordingly, this alternative technique of the present invention allows for the construction of masks having only two phase shifting regions.

Figure 21:
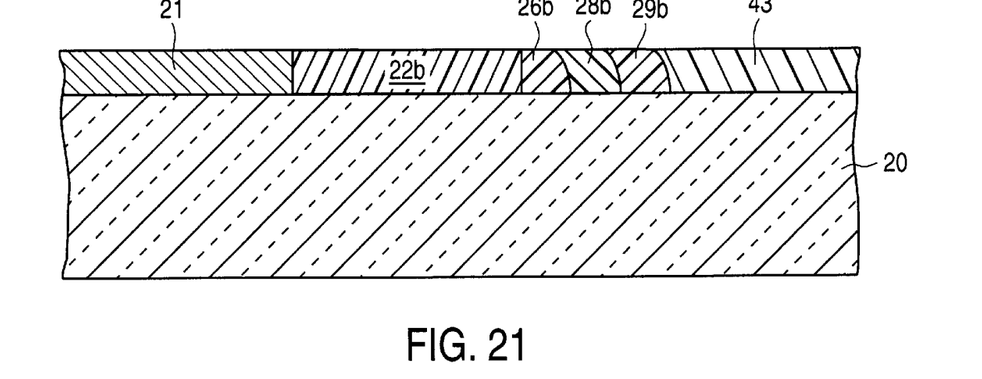
FIG. 21 is a cross-sectional view of another alternative mask in which three self-aligned spacers are formed for constructing a four-phase, phase shifting mask.
Figure 22:
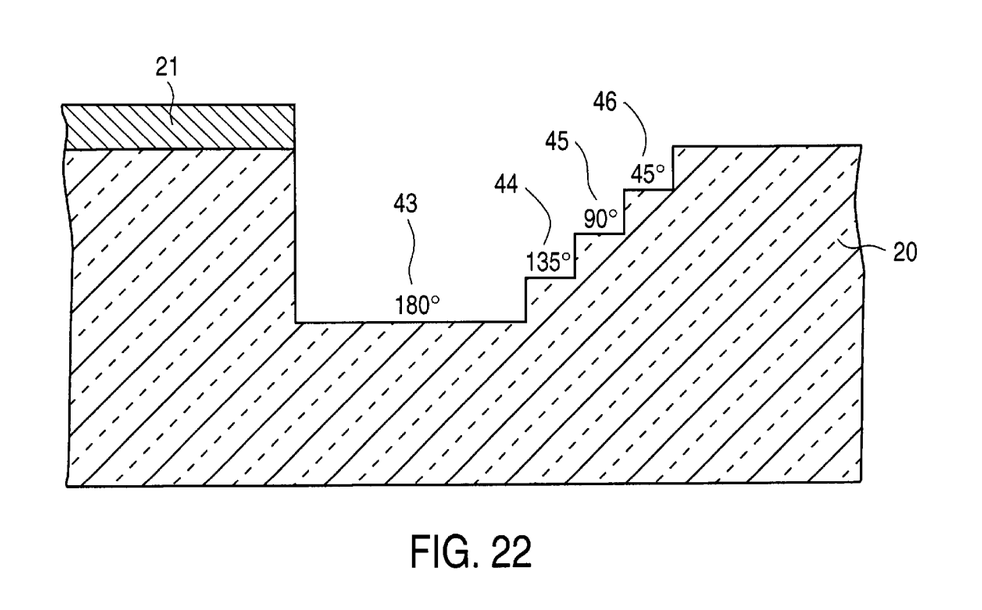
FIG. 22 is a cross-sectional view showing the mask structure when four openings are formed in the substrate to construct the four-phase, phase shifting mask of FIG. 21.

Alternatively, as shown in FIGS. 21 and 22, a four phase mask can also be constructed by the practice of the present invention. In this example, three self-aligned spacers 26b, 28b, and 29b are formed adjacent to each other next to the first material region 22b. In this instance, SiGe can be used for the material of the third self-aligned spacer 29b (which defines the fourth phase shift region). Another material would then be utilized as a fifth material layer 43, which functions as the remaining covering layer. By practicing the technique of the present invention to selectively remove the first, second, third and fourth layers to form four window regions 43–46, four phase shifting regions (for example 45°/90°/135°/180° shifts) can be constructed. Accordingly, masks can be constructed having any number of phase shifts.

It is to be noted that the materials described above for use in defining the various phase shifting regions are provided as examples. Other materials can be readily used to practice the invention. Generally, the material layers are dielectric. Similarly, a variety of etch chemistries are available to practice the invention. The desire is to have selectivity in etching the various materials. Thus, for example, the oxide material layer can be etched using $CF_4$. The nitride material can be etched by using $NF_3$. For etching Polysilicon, $Cl_2$ can be used. For SiGe, $CCl_2F_2$ can be used. Oxygen species is generally introduced to control the etch selectivity as well.

Thus, a technique for fabricating phase shifting regions for a phase shift mask by using a self-aligned spacer formation technique is described. The technique of the present invention can be utilized to construct masks having two, three, four or more phase shifting regions.

We claim:

1. A method of fabricating a phase shift mask comprising:
   forming a plurality of regions of different materials on a surface of a mask substrate to define different phase shifting regions for the mask, wherein at least one material region is formed as a self-aligned spacer;
   removing selectively one material region to expose an underlying portion of the mask substrate;
   removing the exposed portion of the mask substrate previously underlying the selectively removed region to form an opening;
   repeating the selective removal of a next material region, followed by a removal of newly exposed and previously exposed regions of the substrate to form openings at different depths as the different phase shifting regions of the mask.

2. The method of claim 1 wherein said forming the plurality of regions of different materials form the regions from different dielectric materials.

3. The method of claim 1 wherein said forming the plurality of regions of different materials form one region from an oxide material and another region from a nitride material.

4. The method of claim 1 wherein said forming the plurality of regions of different materials form one region from an oxide material, a second region from a nitride material and a third region from a polysilicon material.

5. The method of claim 1 wherein said repeated removing of the exposed portions of the mask substrate form different depths which correspond to phase shifts of 60°, 120° and 180°.

6. The method of claim 1 wherein said repeated removing of the exposed portions of the mask substrate form different depths which correspond to phase shifts of 90° and 180°.

7. The method of claim 1 wherein said repeated removing of the exposed portions of the mask substrate form different depths which correspond to phase shifts of 45°, 90°, 135° and 180°.

8. A method of fabricating a phase shift mask comprising:
forming a first material layer on a surface of a mask substrate to define a first phase shifting region for the mask;
forming a second material layer on the surface of the mask substrate adjacent to the first material layer to define a second phase shifting region for the mask, the second material layer being formed as a first self-aligned spacer, aligned to the first material layer;
removing selectively the first material layer to expose a first portion of the mask substrate underlying the first material layer;
removing the exposed first portion of the mask substrate to form a first opening in the mask substrate;
removing selectively the second material layer of the first self-aligned spacer to expose a second portion of the substrate underlying the first spacer layer;
removing the exposed second portion of the mask substrate to form a second opening in the mask substrate and further removing substrate material from the first opening to a depth greater than the second opening.

9. The method of claim 8 wherein said removing of the exposed portions of the mask substrate form first and second openings at different depths which correspond to phase shifts of 90° and 180°.

10. The method of claim 8 wherein said forming the first and second material layers comprise forming an oxide layer and a nitride layer.

11. The method of claim 8 further comprising: forming a second self-aligned spacer from a third material layer on the surface of the mask substrate adjacent to the first spacer to define a third phase shifting region for the mask, the third material layer being formed after forming the first self-aligned spacer and aligned to the first self-aligned spacer; removing selectively the third material layer of the second self-aligned spacer to expose a third portion of the substrate underlying the second spacer after forming the first and second openings; and removing a third portion of the mask substrate underlying the second spacer to form a third opening as well as further increasing the depths of the first and second openings to form three different phase shifts for the mask.

12. The method of claim 11 wherein said removing of the exposed portions of the mask substrate form first, second and third openings at different depths to form phase shifts which correspond to 60°, 120° and 180°.

13. The method of claim 11 wherein said forming the first, second and third material layers comprise forming an oxide layer, a nitride layer and a polysilicon layer.

14. The method of claim 11 further comprising: forming a third self-aligned spacer from a fourth material layer on the surface of the mask substrate adjacent to the second spacer to define a fourth phase shifting region for the mask, the fourth material layer being formed after forming the second self-aligned spacer and aligned to the second self-aligned spacer; removing selectively the fourth material layer of the third self-aligned spacer to expose a fourth portion of the substrate underlying the third spacer after forming the first, second and third openings; and removing a fourth portion of the mask substrate underlying the third spacer to form a fourth opening, as well as further increasing the depths of the first, second and third openings to form four different phase shifts for the mask.

15. The method of claim 14 wherein said removing of the exposed portions of the mask substrate form first, second, third and fourth openings at different depths to form phase shifts which correspond to 45°, 90°, 135° and 180°.

16. The method of claim 14 wherein said forming the first, second, third and fourth material layers comprise forming an oxide layer, a nitride layer, a polysilicon layer and a silicon germanium layer.

17. A method of fabricating a phase shift mask comprising:
forming a first material layer on a surface of a mask substrate to define a first phase shifting region for the mask;
depositing a second material layer over the substrate, including over the first material layer;
etching anisotropically the second material layer to form a first self-aligned spacer adjacent to the first material layer to define a second phase shifting region for the mask;
etching the first material layer selectively to expose a first portion of the substrate underlying the first material layer;
etching the exposed first portion of the mask substrate to form a first opening in the mask substrate;
etching the second material layer selectively to expose a second portion of the substrate underlying the second material layer;
etching the exposed second portion of the mask substrate to form a second opening in the mask substrate and further removing substrate material from the first opening to a depth greater than the second opening.

18. The method of claim 17 further includes forming a covering layer over exposed portions of the mask substrate to prevent the removal of the substrate at locations where phase shifters are not desired.

19. The method of claim 18 further comprising: depositing a third material layer on the surface of the mask substrate after forming the first self-aligned spacer; etching anisotropically the third material layer to form a second self-aligned spacer adjacent to the first spacer to define a third phase shifting region for the mask; etching selectively the third material layer to expose a third portion of the substrate underlying the second spacer after forming the first and second openings; and etching a third portion of the mask substrate underlying the second spacer to form a third opening, as well as further increasing the depths of the first and second openings to form three different phase shifts for the mask.

20. The method of claim 19 wherein the depositing of first, second, and third layers comprise the depositing of three different dielectric materials.

21. The method of claim 19 further comprising: depositing a fourth material layer on the surface of the mask substrate after forming the second self-aligned spacer; etching anisotropically the fourth material layer to form a third self-aligned spacer adjacent to the second spacer to define a fourth phase shifting region for the mask; etching selectively the fourth material layer to expose a fourth portion of the substrate underlying the third spacer after forming the first, second and third openings; and etching a fourth portion of the mask substrate underlying the third spacer to form a fourth opening, as well as further increasing the depths of the first, second and third openings to form four different phase shifts for the mask.

22. The method of claim 21 wherein the depositing of first, second, third and fourth layers comprise the depositing of four different dielectric materials.

23. A phase shift mask for providing a plurality of phase shifts comprising:
a mask substrate comprised of a transparent material;

a plurality of phase shifting regions disposed as openings formed into the mask substrate, wherein at least one shifting region is formed by:
  (a) forming a plurality of different materials on a surface of the mask substrate to define different phase shifting regions for the mask;
  (b) forming at least one material region as a self-aligned spacer;
  (c) removing selectively one material region to expose an underlying portion of the mask substrate;
  (d) removing the exposed portion of the mask substrate previously underlying the selectively removed region to form an opening;
  (e) repeating (c) and (d) to remove newly exposed and previously exposed regions of the substrate to form openings at different depths as the different phase shifting regions of the mask.

24. The phase shift mask of claim 23 wherein the material layers formed on the surface are dielectric materials.

* * * * *